(12) United States Patent
Paniconi et al.

(10) Patent No.: US 9,490,850 B1
(45) Date of Patent: Nov. 8, 2016

(54) METHOD AND APPARATUS FOR DECODING PACKETIZED DATA

(75) Inventors: Marco Paniconi, Campbell, CA (US); Mikhal Shemer, Berkeley, CA (US)

(73) Assignee: GOOGLE INC., Mountain View, CA (US)

( * ) Notice: Subject to any disclaimer, the term of this patent is extended or adjusted under 35 U.S.C. 154(b) by 1286 days.

(21) Appl. No.: 13/305,175

(22) Filed: Nov. 28, 2011

(51) Int. Cl.
  *H04N 7/12* (2006.01)
  *H03M 13/35* (2006.01)

(52) U.S. Cl.
  CPC ......... *H03M 13/353* (2013.01); *H03M 13/356* (2013.01)

(58) Field of Classification Search
  CPC ........... H03M 13/356; H03M 13/373; H03M 13/353
  See application file for complete search history.

(56) References Cited

U.S. PATENT DOCUMENTS

| | | | |
|---|---|---|---|
| 5,731,840 A | 3/1998 | Kikuchi et al. | |
| 6,108,383 A | 8/2000 | Miller et al. | |
| 6,266,337 B1 | 7/2001 | Marco | |
| 6,421,387 B1 | 7/2002 | Rhee | |
| 6,483,928 B1 | 11/2002 | Bagni et al. | |
| 6,556,588 B2 | 4/2003 | Wan et al. | |
| 6,587,985 B1 | 7/2003 | Fukushima et al. | |
| 6,681,362 B1 | 1/2004 | Abbott et al. | |
| 6,684,354 B2 | 1/2004 | Fukushima et al. | |
| 6,732,313 B2 | 5/2004 | Fukushima et al. | |
| 6,741,569 B1 | 5/2004 | Clark | |
| 6,865,178 B1 * | 3/2005 | Euget | H04L 45/245 370/352 |
| 6,918,077 B2 | 7/2005 | Fukushima et al. | |
| 6,952,450 B2 | 10/2005 | Cohen | |
| 7,124,333 B2 | 10/2006 | Fukushima et al. | |
| 7,180,896 B1 | 2/2007 | Okumura | |
| 7,263,644 B2 | 8/2007 | Park et al. | |
| 7,356,750 B2 | 4/2008 | Fukushima et al. | |
| 7,372,834 B2 | 5/2008 | Kim et al. | |
| 7,376,880 B2 | 5/2008 | Ichiki et al. | |
| 7,447,235 B2 | 11/2008 | Luby et al. | |
| 7,447,969 B2 | 11/2008 | Park et al. | |
| 7,471,724 B2 | 12/2008 | Lee | |
| 7,484,157 B2 | 1/2009 | Park et al. | |
| 7,502,818 B2 | 3/2009 | Kohno et al. | |
| 7,577,898 B2 | 8/2009 | Costa et al. | |
| 7,636,298 B2 | 12/2009 | Miura et al. | |
| 7,680,076 B2 | 3/2010 | Michel et al. | |
| 7,756,127 B2 | 7/2010 | Nagai et al. | |
| 7,823,039 B2 | 10/2010 | Park et al. | |

(Continued)

OTHER PUBLICATIONS

Friedman, et al., "RTP: Control Protocol Extended Reports (RTPC XR)," Network Working Group RFC 3611 (The Internet Society 2003) (52 pp).

(Continued)

*Primary Examiner* — Nhon Diep
(74) *Attorney, Agent, or Firm* — Young Basile Hanlon & MacFarlane, P.C.

(57) ABSTRACT

A method for decoding a packetized video signal including at least one encoded frame. In one case, the method includes receiving at least one FEC packet at a receiving station. The receiving station uses embedded data associated with the FEC packet to obtain more accurate knowledge of the packet loss state of the media packets. This improved knowledge can allow the receiver to make better use of packet retransmission requests. The embedded data associated with the FEC packet can include in some cases a base sequence number and a packet mask.

20 Claims, 10 Drawing Sheets

(56) References Cited

U.S. PATENT DOCUMENTS

| | | | |
|---|---|---|---|
| 7,886,071 | B2 | 2/2011 | Tomita |
| 7,974,243 | B2 | 7/2011 | Nagata et al. |
| 8,060,651 | B2 | 11/2011 | Deshpande et al. |
| 8,085,767 | B2 | 12/2011 | Lussier et al. |
| 8,139,642 | B2 | 3/2012 | Vilei et al. |
| 8,233,539 | B2 | 7/2012 | Kwon |
| 8,438,451 | B2 | 5/2013 | Lee et al. |
| 8,661,323 | B2* | 2/2014 | Paniconi ............... 714/776 |
| 8,666,186 | B1 | 3/2014 | Rasche |
| 8,726,136 | B2* | 5/2014 | Fang ..................... 714/776 |
| 8,856,624 | B1 | 10/2014 | Paniconi |
| 9,185,429 | B1 | 11/2015 | Gu et al. |
| 2002/0035714 | A1 | 3/2002 | Kikuchi et al. |
| 2002/0085637 | A1 | 7/2002 | Henning |
| 2002/0157058 | A1 | 10/2002 | Ariel et al. |
| 2003/0012287 | A1 | 1/2003 | Katsavounidis et al. |
| 2003/0098992 | A1 | 5/2003 | Park et al. |
| 2003/0226094 | A1 | 12/2003 | Fukushima et al. |
| 2003/0229822 | A1 | 12/2003 | Kim et al. |
| 2004/0165585 | A1 | 8/2004 | Imura et al. |
| 2004/0196860 | A1* | 10/2004 | Gao et al. ............... 370/437 |
| 2005/0024487 | A1 | 2/2005 | Chen |
| 2005/0076272 | A1 | 4/2005 | Delmas et al. |
| 2005/0154965 | A1 | 7/2005 | Ichiki et al. |
| 2005/0180415 | A1 | 8/2005 | Cheung et al. |
| 2006/0005106 | A1 | 1/2006 | Lane et al. |
| 2006/0109805 | A1* | 5/2006 | Malamal Vadakital et al. ............... 370/299 |
| 2006/0146940 | A1 | 7/2006 | Gomila et al. |
| 2006/0150055 | A1 | 7/2006 | Quinard et al. |
| 2006/0188024 | A1 | 8/2006 | Suzuki et al. |
| 2006/0248563 | A1 | 11/2006 | Lee et al. |
| 2006/0251011 | A1* | 11/2006 | Ramakrishnan et al. .... 370/328 |
| 2006/0291475 | A1 | 12/2006 | Cohen |
| 2007/0168824 | A1 | 7/2007 | Fukushima et al. |
| 2007/0250754 | A1 | 10/2007 | Costa et al. |
| 2007/0296822 | A1 | 12/2007 | Lan et al. |
| 2008/0089414 | A1 | 4/2008 | Wang et al. |
| 2008/0101403 | A1 | 5/2008 | Michel et al. |
| 2008/0109707 | A1 | 5/2008 | Dell et al. |
| 2008/0134005 | A1 | 6/2008 | Izzat et al. |
| 2008/0209300 | A1 | 8/2008 | Fukushima et al. |
| 2008/0225944 | A1 | 9/2008 | Pore et al. |
| 2008/0250294 | A1 | 10/2008 | Ngo et al. |
| 2009/0006927 | A1 | 1/2009 | Sayadi et al. |
| 2009/0022157 | A1 | 1/2009 | Rumbaugh et al. |
| 2009/0059917 | A1 | 3/2009 | Lussier et al. |
| 2009/0080510 | A1 | 3/2009 | Wiegand et al. |
| 2009/0103635 | A1 | 4/2009 | Pahalawatta |
| 2009/0138784 | A1 | 5/2009 | Tamura et al. |
| 2009/0249158 | A1 | 10/2009 | Noh et al. |
| 2009/0276686 | A1 | 11/2009 | Liu et al. |
| 2009/0303176 | A1 | 12/2009 | Chen et al. |
| 2009/0327842 | A1 | 12/2009 | Liu et al. |
| 2010/0080297 | A1 | 4/2010 | Wang et al. |
| 2010/0085963 | A1 | 4/2010 | Bekiares et al. |
| 2010/0122127 | A1 | 5/2010 | Oliva et al. |
| 2010/0153828 | A1 | 6/2010 | De Lind Van Wijngaarden et al. |
| 2010/0171882 | A1 | 7/2010 | Cho et al. |
| 2010/0202414 | A1 | 8/2010 | Malladi et al. |
| 2010/0306618 | A1 | 12/2010 | Kim et al. |
| 2011/0194605 | A1 | 8/2011 | Amon et al. |
| 2012/0147140 | A1 | 6/2012 | Itakura et al. |
| 2012/0290900 | A1 | 11/2012 | Paniconi |
| 2013/0031441 | A1 | 1/2013 | Ngo et al. |
| 2013/0044183 | A1 | 2/2013 | Jeon et al. |
| 2014/0072035 | A1 | 3/2014 | Rabii |

OTHER PUBLICATIONS

U.S. Appl. No. 13/103,565, filed May 9, 2011 titled "Method and Apparatus for Generating Packet Mask", Inventor: Paniconi.

U.S. Appl. No. 13/305,021, filed Nov. 28, 2011 titled "Method and Apparatus for Requesting Retransmission of Missing Packets in Data Communications", Inventors: Shemer et al.

U.S. Appl. No. 13/305,175, filed Nov. 28, 2011 titled "Method and Apparatus for Decoding Packetized Data", Inventors: Paniconi et al.

U.S. Appl. No. 13/421,031, filed Mar. 15, 2012 titled "Adaptive Protection Modes for Packet Loss in Digital Video Streams", Inventors: Paniconi et al.

Roca, Vincent, et al., Design and Evaluation of a Low Density Generator Matrix (LDGM) Large Block FEC Codec, INRIA Rhone-Alpes, Planete project, France, Date Unknown, (12 pp).

Li, A., "RTP Payload Format for Generic Forward Error Correction", Network Working Group, Standards Track, Dec. 2007, (45 pp).

Wikipedia, the free encyclopedia, "Low-density parity-check code", http://en.wikipedia.org/wiki/Low-density_parity-check_code, Jul. 30, 2012 (5 pp).

Frossard, Pascal; "Joint Source/FEC Rate Selection for Quality-Optimal MPEG-2 Video Delivery", IEEE Transactions on Image Processing, vol. 10, No. 12, (Dec. 2001) pp. 1815-1825.

International Search Report and Written Opinion for International Application No. PCT/US2011/051818 dated Nov. 21, 2011 (16 pages).

Korhonen, Jari; Frossard, Pascal; "Flexible forward error correction codes with application to partial media data recovery", Signal Processing: Image Communication vol. 24, No. 3 (Mar. 2009) pp. 229-242.

Liang, Y.J.; Apostolopoulos, J.G.; Girod, B., "Analysis of packet loss for compressed video: does burst-length matter?," Acoustics, Speech and Signal Processing, 2003. Proceedings. (ICASSP '03). 2003 IEEE International conference on, vol. 5, no., pp. V, 684-7 vol. 5, Apr. 6-10, 2003.

Yoo, S. J.B., "Optical Packet and burst Switching Technologies for the Future Photonic Internet," Lightwave Technology, Journal of, vol. 24, No. 12, pp. 4468, 4492, Dec. 2006.

Yu, Xunqi, et al; "The Accuracy of Markov Chain Models in Predicting Packet-Loss Statistics for a Single Multiplexer", IEEE Transaactions on Information Theory, vol. 54, No. 1 (Jan. 2008) pp. 489-501.

Bankoski et al. "Technical Overview of VP8, an Open Source Video Codec for the Web". Dated Jul. 11, 2011.

Bankoski et al. "VP8 Data Format and Decoding Guide" Independent Submission. RFC 6389, Dated Nov. 2011.

Bankoski et al. "VP8 Data Format and Decoding Guide; draft-bankoski-vp8-bitstream-02" Network Working Group. Internet-Draft, May 18, 2011, 288 pp.

Implementors' Guide; Series H: Audiovisual and Multimedia Systems; Coding of moving video: Implementors Guide for H.264: Advanced video coding for generic audiovisual services. H.264. International Telecommunication Union. Version 12. Dated Jul. 30, 2010.

Overview; VP7 Data Format and Decoder. Version 1.5. On2 Technologies, Inc. Dated Mar. 28, 2005.

Series H: Audiovisual and Multimedia Systems; Infrastructure of audiovisual services—Coding of moving video. H.264. Advanced video coding for generic audiovisual services. International Telecommunication Union. Version 11. Dated Mar. 2009.

Series H: Audiovisual and Multimedia Systems; Infrastructure of audiovisual services—Coding of moving video. H.264. Advanced video coding for generic audiovisual services. International Telecommunication Union. Version 12. Dated Mar. 2010.

Series H: Audiovisual and Multimedia Systems; Infrastructure of audiovisual services—Coding of moving video. H.264. Amendment 2: New profiles for professional applications. International Telecommunication Union. Dated Apr. 2007.

Series H: Audiovisual and Multimedia Systems; Infrastructure of audiovisual services—Coding of moving video. H.264. Advanced video coding for generic audiovisual services. Version 8. International Telecommunication Union. Dated Nov. 1, 2007.

Series H: Audiovisual and Multimedia Systems; Infrastructure of audiovisual services—Coding of moving video; Advanced video coding for generic audiovisual services. H.264. Amendment 1:

(56) References Cited

OTHER PUBLICATIONS

Support of additional colour spaces and removal of the High 4:4:4 Profile. International Telecommunication Union. Dated Jun. 2006.
Series H: Audiovisual and Multimedia Systems; Infrastructure of audiovisual services—Coding of moving video; Advanced video coding for generic audiovisual services. H.264. Version 1. International Telecommunication Union. Dated May 2003.
Series H: Audiovisual and Multimedia Systems; Infrastructure of audiovisual services—Coding of moving video; Advanced video coding for generic audiovisual services. H.264. Version 3. International Telecommunication Union. Dated Mar. 2005.
VP6 Bitstream & Decoder Specification. Version 1.02. On2 Technologies, Inc. Dated Aug. 17, 2006.
VP6 Bitstream & Decoder Specification. Version 1.03. On2 Technologies, Inc. Dated Oct. 29, 2007.
VP8 Data Format and Decoding Guide. WebM Project. Google On2. Dated: Dec. 1, 2010.
Wenger et al.; RTP Payload Format for H.264 Video; The Internet Society; Feb. 2005.
Wiegand et al, "Overview of the H 264/AVC Video Coding Standard," IEEE Transactions on Circuits and Systems for Video Technology, vol. 13, No. 7, pp. 568, 569, Jul. 1, 2003.
Wiegand, Digital Image Communication: Pyramids and Subbands, 21 pages.
Wiegand, Thomas, Study of Final Committee Draft of Joint Video Specification (ITU-T Rec. H.264 | ISO/IEC 14496-10 AVC), Joint Video Team (JVT) of ISO/IEC MPEG & ITU-T VCEG (ISO/IEC JTC1/SC29/WG11 and ITU-T SG16 Q.6), JVT-F100, Dec. 5, 2002.
Wiegand, Thomas, et al.; "Long-Term Memory Motion-Compensated Prediction", Publication Unknown, Date Unknown, 15 pp.
Wiegand, Thomas, et al.; "Rate-Distortion Optimized Mode Selection for Very Low Bit Rate Video Coding and the Emerging H.263 Standard", IEEE Transactions on Circuits and Systems for Video Technology, vol. 6, No. 2, Apr. 1996, 9 pp.
Wright, R. Glenn, et al.; "Multimedia—Electronic Technical Manual for ATE", IEEE 1996, 3 pp.
Wu, Xiaolin, et al., "Calic-A Context based Adaptive :oss;ess Image Codec", 1996 IEEE International Conferece, vol. 4, 4 pages.
Zhang, Kui, et al.; "Variable Block Size Video Coding With Motion Prediction and Motion Segmentation", SPIE vol. 2419, 1995, 9 pp.
Zhi Liu, Zhaoyang Zhang, Liquan Shen, Mosaic Generation in H.264 Compressed Domain, IEEE 2006.
Han et al., RPT: Re-architecting Loss Protection for Content-Aware Networks.

\* cited by examiner

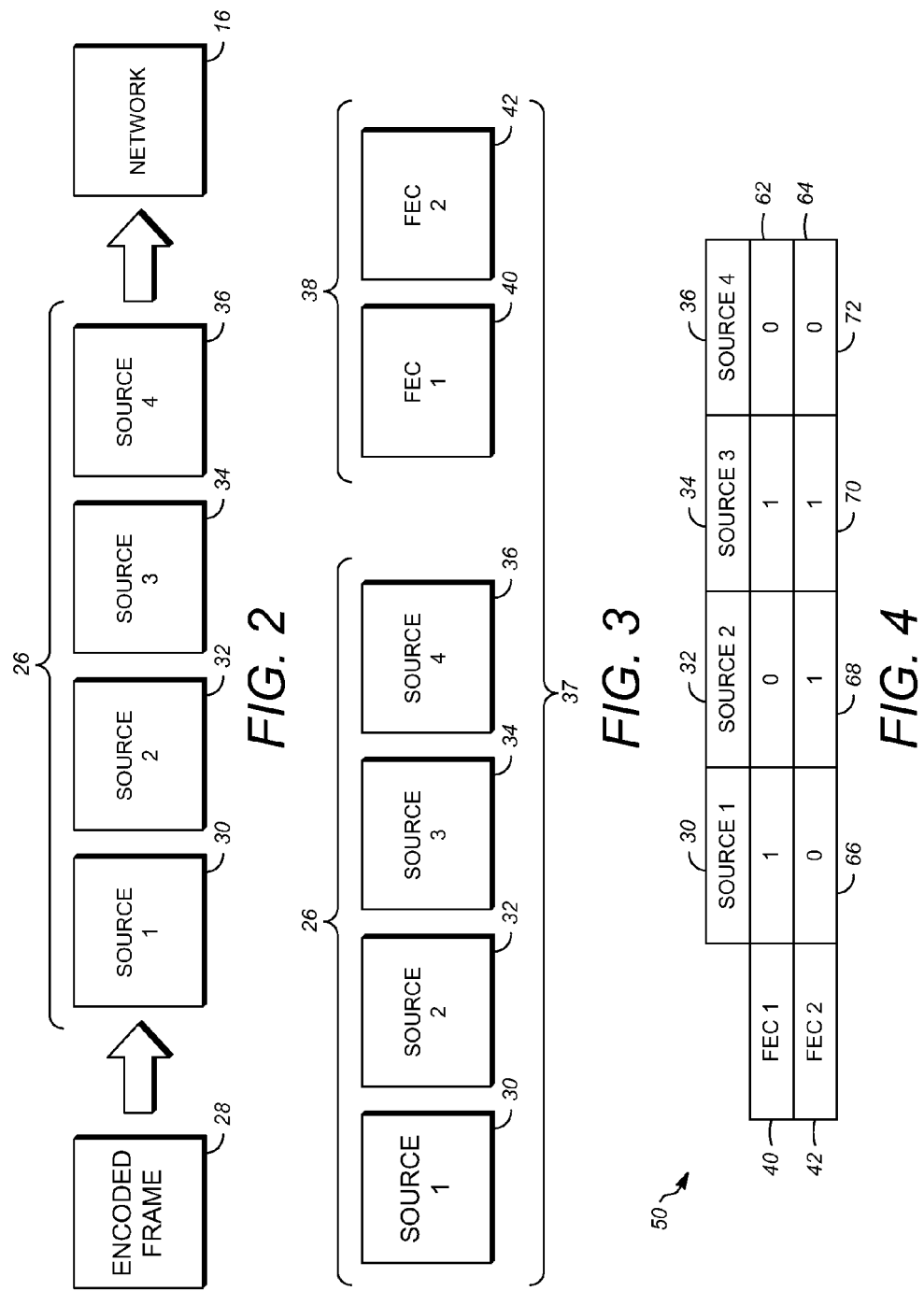

METHOD AND APPARATUS FOR DECODING PACKETIZED DATA

RELATED APPLICATIONS

This application is related to co-pending application Ser. No. 13/305,021 filed Nov. 28, 2011 and entitled "METHOD AND APPARATUS FOR REQUESTING RETRANSMISSION OF MISSING PACKETS IN DATA COMMUNICATIONS" which is hereby incorporated by reference in its entirety.

TECHNICAL FIELD

The present invention relates to the field of data communications including techniques for error correction.

BACKGROUND

Many kinds of data are transmitted over the Internet and other networks, including video and audio data. Data can for example be transmitted from one computer or other transmitting station to another remote computer or other receiving station. Data transmission over networks such as the Internet is frequently accomplished by packetizing the message to be transmitted—that is, by dividing the message into packets which are reassembled at the receiving end to reconstruct the original message.

Packets may be lost or delayed during transmission, resulting in corruption of the message. This can be especially problematic when it occurs during real time transmission of data (such as during voice over IP (VOIP) session or video conferencing). A video frame with lost or missing packets is referred to as an incomplete or partial frame.

Methods have been proposed to address the problem of packet loss. These methods include forward error correction (hereinafter "FEC" coding) and negative acknowledgment requests (hereinafter, "NACK" requests). FEC coding involves the transmitting station generating redundant FEC packets. These redundant FEC packets are transmitted along with the underlying source (i.e., video or other media) packets. The FEC packets can be used by a receiving station to reconstruct packets that are lost during transmission. Generally speaking, NACK requests are sent by the receiving station to request retransmission of lost packets that the receiving station cannot reconstruct using FEC packets. The receiving station can detect lost packets by identifying gaps in the packet sequence numbers of the packets that are received. The packet sequence numbers can be included in a packet header, such as an RTP header.

SUMMARY

Embodiments are disclosed for decoding correcting errors in data communications. One aspect of the disclosed embodiments is a method for decoding a packetized video signal including at least one encoded frame. The method includes receiving the packetized video signal over a network. The packetized video signal has at least one received packet associated with the encoded frame and having embedded data. The method also includes identifying at least one lost packet that is missing from the packetized video signal as received over the network. At least one packet loss state value based at least in part upon at least a portion of the embedded data.

In accordance with another aspect of the disclosed embodiments, an apparatus is provided for decoding a packetized signal that has at least one encoded frame including a first packet with packet header information. The apparatus includes a memory and a processor configured to execute instructions stored in the memory. As explained in the detailed description, memory and processor, although referred to in the singular, can each include one or more devices (including devices of different type) such as parallel processors or multicore processors. The processor is programmed to identify, by means of a gap in the sequence of packet sequence numbers in the packetized signal, a lost packet that is missing from the packetized signal. The processor determines whether the lost packet is likely to be a source packet or an error correction packet, based on the packet header information of the first packet.

In accordance with another aspect of the disclosed embodiments, a computer program product is provided that includes computer readable medium having instructions encoded thereon. As explained in the detailed description, the computer readable media can include random access memory, a hard drive, removable media or any other memory device. The instructions cause the processor to receive the packetized video signal including at least a first packet associated with the at least one encoded frame and having a packet header information. The instructions also cause the processor to identify a second packet that is missing from the packetized video signal as received; and determine whether the second packet is likely to be a source packet or an error correction packet, based on the packet header information of the first packet. The packet header information is at least one of a packet sequence number, a base sequence number or a packet mask.

BRIEF DESCRIPTION OF THE DRAWINGS

The description herein makes reference to the accompanying drawings wherein like reference numerals refer to like parts throughout the several views, and wherein:

FIG. 2 is a schematic diagram of packetized video data transmitted over the communications system of FIG. 1;

FIG. 3 is a schematic diagram of packetized video data, including FEC packets, transmitted over the communications system of FIG. 1;

FIG. 4 is a schematic diagram of a packet mask;

DETAILED DESCRIPTION

Disclosed are methods and apparatuses for selectively retransmitting lost packets. One drawback to retransmission of video data is that the request for the retransmission of packets can result in a delay as the receiver waits for lost packets to complete an incomplete or partial frame. Another drawback of retransmission is that network congestion is sometimes increased if too many lost packets are retransmitted. It is the case, however, that in a video transmission, some packets are of a nature that their loss does not degrade video quality to an unacceptable level. For example, a partial frame might be capable of decoding with an acceptable quality level even though one of the packets containing part of the frame has been lost. Even if there is some degradation in quality from decoding a partial frame, end users may rather endure that degradation than experience a delay in rendering the frame (which delay might be occasioned by waiting for retransmission of the missing packets), particularly in the case of real time video communications.

Thus, in some of the embodiments described below, a determination is made by a receiving station, a transmitting station, or both to selectively request or re-transmit lost packets based on an assessment that considers the cost of the retransmission and the quality of decoding partial frames. In some embodiments, the assessment can be made by using a function of the distortion occasioned by decoding a frame having a missing packet and the delay of re-transmitting the missing packet.

In making a determination as to whether a missing packet should be re-transmitted, it is useful to have information about the missing packet. For example, when both NACK and FEC are used in a video transmission, it is sometimes the case that FEC packets are lost in transmission. In some cases, the receiving station not need to request retransmission of the lost FEC packet, such as for example when the underlying source packets have been successfully transmitted. If the missing packet were known to be an FEC packet, then a determination could be made to forego retransmission. Also, it is useful to know which frame or partition the missing packets are from to determine whether the partial frame can be decoded with an acceptable degradation in quality, such as during bursty packet loss or when the first or last packet of a frame is lost. The term "packet loss state" is used herein to refer to information about packet loss, such as the number of packets lost and/or the frames (or, in some cases, partitions within frames) from which packets are lost, whether lost packets are source or error correcting packets. In some of the embodiments described below, the packet loss state can be determined at least in part using information embedded in the received FEC packets. This information can be used, along with other inputs, to selectively determine whether a missing packet or packets should be re-transmitted.

Figure 1:
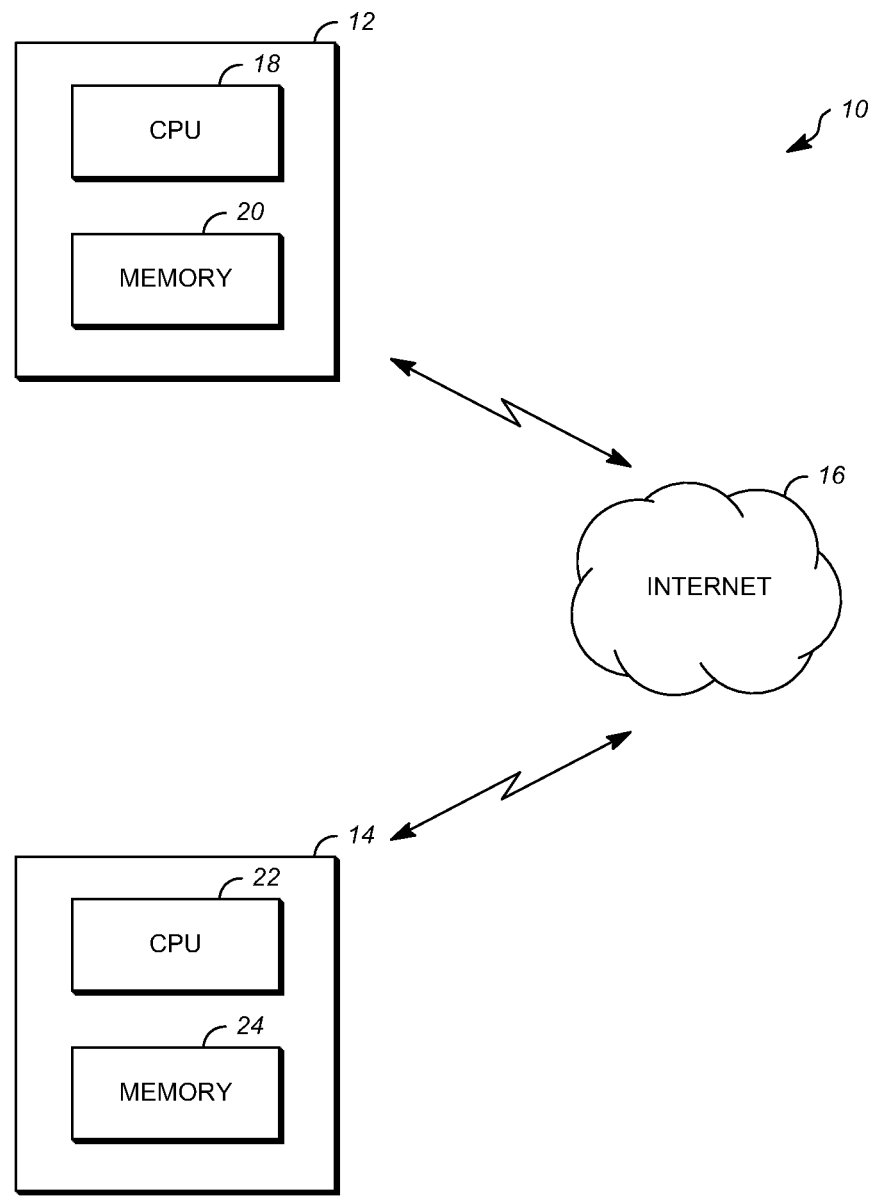
FIG. 1 is a block diagram of a communications system including a transmitting station and a receiving station.

FIG. 1 is a block diagram of a communications system 10 including a transmitting station 12 and a receiving station 14. Transmitting station 12 and receiving station 14 communicate over a communications network 16, which is in this case the Internet; however, other wired and/or wireless communication networks can be used such as local area networks and wide area networks. In this illustration, transmitting station 12 includes a processor 18 and a memory 20. Receiving station 14 includes a processor 22 and memory 24. Processors 18 and 22 can be computers, servers, or any other computing device or system capable of manipulating or processing information now-existing or hereafter developed, including optical processors, quantum processors and/or molecular processors, general purpose processors, special purpose processors, IP cores, ASICS, programmable logic arrays, programmable logic controllers, microcode, firmware, microcontrollers, microprocessors, digital signal processors, memory, or any combination of the foregoing. In the claims, the term "processor" should be understood as encompassing any the foregoing, either singly or in combination.

Memories 20 and 24 are random access memory (RAM) although any other suitable type of storage device can be used. Generally, processors 18, 22 can receive program instructions and data from memory 20, 24, which can be used by the processor for performing the methods described below.

Although FIG. 1 depicts that processors 18, 22 and memories 20,24 are integrated into single units, this depiction is exemplary only. The operations of transmitting station 12 and receiving station 14 can be distributed across multiple processors on the same machine or different machines or across a network such as a local area network, wide area network or the Internet and the terms "receiving station" and "transmitting station" can encompass such multi-machine systems. For example, while processors 18 and 22 are illustrated as unitary devices, they can be implemented as multiple processing units such as in machines with multiple processing units or in multiple machines operating with single or multiple processing units and the term "processor" is intended to encompass all of these and other configurations. Memories 20, 24 can also be integral units (such as the RAM within a computer) or can be distributed across multiple machines such as a network-based memory or memory in multiple machines performing the operations of transmitting station 12 and receiving station 14.

In this example, transmitting station 12 and receiving station 14 are used to communicate in real time to permit parties at each station to engage in a videoconference over the Internet. The designation of a station 12 or 14 as "receiving" or "transmitting" is arbitrary and for purposes of illustration. With two-way real time communication, one station 12, 14 will be the transmitting station with respect to a particular message, and the other station 12, 14 will be the receiving station; but these roles can be reversed depending on which station is transmitting a particular message.

Transmitting station 12 and receiving station 14 can be implemented in a wide variety of configurations, including for example on servers in a video conference system. Alternatively, transmitting station 12 can be implemented on a server and receiving station 14 can be implemented on a mobile device such as a mobile telephone or other hand-held communications or computing device. Alternatively, both transmitting station 12 and receiving station 14 can be hand-held devices. Alternatively, receiving station 14 can be a stationary personal computer rather than a mobile device.

FIG. 2 is a schematic diagram of packetized video data 26 transmitted over the communications network 16 of FIG. 1. Packetized video data 26 is derived from an encoded frame 28 of video data. For purposes of illustration, packetized video data 26 is illustrated as including four source packets 30, 32, 34 and 36 (also referred to herein as Source 1, Source 2, Source 3 and Source 4 respectively). Source packets 30-36 contain the data composes all or a portion of encoded frame 28. The process of packetization can take place at transmitting station 12. After the video data is packetized, source packets 30-36 are transmitted over communications network 16.

FIG. 3 is a schematic diagram of a packetized output signal 37, including source packets 26 and error correction packets 38, transmitted over the communications network 16 of FIG. 1. Packetized output signal 37 is derived from encoded frame 28 of video data as shown in FIG. 2. Error correction packets 38 are derived using a packet mask as described below. One suitable scheme for implementing error correction packets for packetized network transmission is defined by RFC 5109, published by the Internet Engineering Task Force, c/o Corporation for National Research Initiatives, Reston Va. 20190. Aspects of embodiments of this invention optionally implement forward error correction (FEC) as defined in RFC 5109. Error correction packets 38 comprise two FEC packets, namely an FEC packet 40 and an FEC packet 42. FEC packets 40 and 42 are sometimes referred to herein as FEC 1 and FEC 2, respectively. FEC packets 40 and 42 contain information used by the receiving station 14 to correct packet loss and other errors that may occur in transmitted packets when packetized output signal 37 is transmitted over a communications network 16. Typically, packets are the same size. If the packets are different sizes, the shorter packet can be padded with zeros. Other types of error correcting packets may be used.

FEC packets 40 and 42 are generated by transmitting station 12 using a packet mask. FIG. 4 is a schematic diagram showing a highly simplified, exemplary packet mask 50 used to create the FEC packets 40 and 42 of FIG. 3. Mask 50 is a matrix that specifies the linear combination of source packets to generate an FEC packet. The linear combination is applied over the whole packet data by a byte wise exclusive OR operation (XOR). The packet mask (or the relevant row of the matrix/mask for that packet) is contained in each FEC packet, so the decoder has access to this information (at least for a received FEC packet), and hence can perform the recovery operation.

For example, referring to FIG. 4, packet mask 50 is represented by a four-by-two matrix having rows 62 and 64 and columns 66, 68, 70 and 72. Rows 62 and 64 correspond to FEC packets 40 and 42, respectively. Columns 66, 68, 70 and 72 correspond to source packets 30, 32, 34 and 36, respectively. The values of the matrix are either one or zero, with one indicating which source packets are combined (via an XOR operation) to create the corresponding FEC packet. For example, in row 62 of matrix 50, the values in columns 66 and 70 are "one" signifying that FEC packet 40 is a combination (XOR) of source packets 30 and 34. Likewise, in row 64 of matrix 50, the values in columns 68 and 70 are "one," signifying that FEC packet 42 is a combination (XOR) of source packets 32 and 34. If only source packets 30, 32 and 36 are received at receiving station 14, then lost source packet 34 can be recovered by the receiving station if either or both of FEC packets 40 or 42 are received. Each packet can include a copy of the packet mask used to generate the packet, that is, each FEC packet includes a copy of the corresponding row of the packet mask matrix. This copy of the packet mask is used by receiving station 14 to decode the packets if it is necessary to reconstruct lost source packets.

Figure 5:
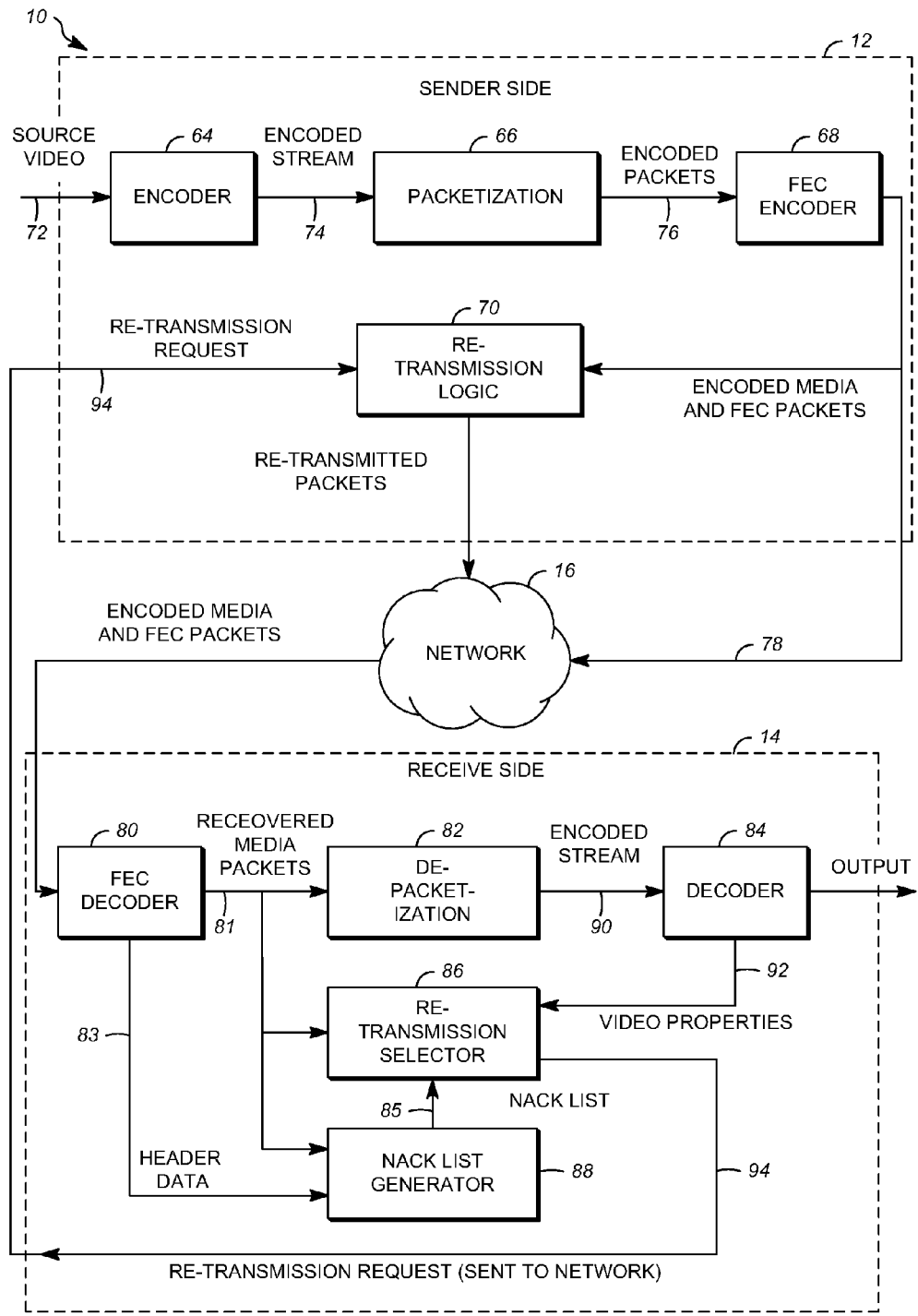
FIG. 5 is a block diagram of the communication system of FIG. 1 showing in greater detail the functionality of transmitting station and receiving station.

FIG. 5 is block diagram showing the communications system 10 of FIG. 1 in greater detail, including the functional stages of transmitting station 12 and receiving station 14. In one exemplary embodiment, these stages are implemented using software resident in memories 20 and 24 that is executed by CPUs 18 and 22, respectively. Other configurations are possible, including distributing the functional stages across multiple processors or implementing all or a portion of the functional stages through specialized hardware, for example.

Referring still to FIG. 5, transmitting station 12 includes a video encoder stage 64, a packetization stage 66, and FEC encoder stage 68 and a retransmission logic stage 70. Source video signal 72 is received by video encoder stage 64. Source video signal 72 can be raw video such as received from a camera (not shown) that is attached as a peripheral to transmitting station 12. Video encoder stage 64 encodes the source video signal 72 using a conventional video encoding scheme such as VP8 or H.264. The output of video encoder stage 64 is an encoded stream 74 of video data that is accepted as input by packetization stage 66. Packetization stage 66 breaks down encoded stream 74 into source packets (such as source packets 30-36 as shown in FIG. 2). Encoded packets 76 are output from packetization stage 66, which are accepted as input to FEC encoder stage 68. FEC encoder stage 68 generates the FEC packets (such as FEC packets 40 and 42 as shown in FIG. 3) which are interspersed with the encoded source packets to create the packetized output signal 78. FEC packets are optionally applied in this case on a frame level in accordance with the RFC 5109 standard. Packetized output signal 78 is transmitted by transmitting station 12 to receiving station 14 via network 16. Packetized output signal 78 is also accepted as input to retransmission logic stage 70, the function of which is described below.

Figure 7:
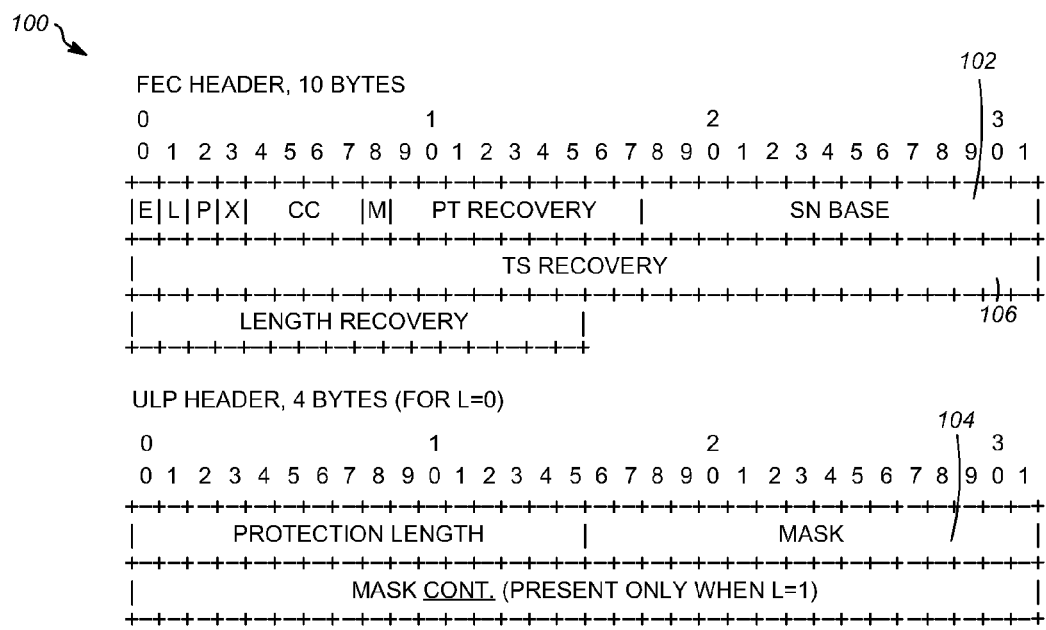
FIG. 7 is a schematic diagram of a exemplary FEC packet header.

Referring still to FIG. 5, receiving station 14 includes a FEC decoder stage 80, a de-packetization stage 82, a video decoder stage 84, a retransmission selector stage 86, and a NACK list generator stage 88. FEC decoder stage 80 accepts as input packetized output signal 78 that was transmitted by transmitting station 12. Note that packetized output signal 78 as received by FEC decoder stage 80 typically will be missing one or more packets that were included in the original packetized output signal 78 transmitted by transmitting station 12. FEC decoder stage 80 uses FEC packets that are received in packetized output signal 78 to recover missing source packets to the extent possible. The output of FEC decoder stage 80 includes the recovered media packets 81 of packetized output signal 78 including source packets which may have been lost in transmission but which were reconstructed using FEC decoder stage 80. The output of FEC decoder stage 80 also includes FEC header data 83 extracted from packetized video output signal. FEC header data in some cases can include one or more of the following: the time-stamp and sequence number of the FEC packet (this may be contained in the RTP header of the FEC packet), and the base sequence number and packet mask of the FEC packet (this may be contained within the FEC header itself, as shown in FIG. 7).

Recovered media packets 81 which are generated as output by FEC decoder stage 80 are accepted as input by de-packetization stage 82 and by NACK list generator 88. NACK list generator 88 in turn generates as output a NACK list 85 based on FEC header data 83 received as input from FEC decoder stage 80, and the packet header data of the recovered packets 81. NACK list 85 is received as input by retransmission selector stage 86. The functions of NACK list generator stage 88 and retransmission selector stage 86 are described below.

De-packetization stage 82 re-assembles recovered media packets 81 to generate as output an encoded stream 90 corresponding to encoded stream 74 generated by encoder in transmitting station. Note that encoded stream 90 may not include all of the data in encoded stream 74 as some packets of packetized output signal 78 have been lost and remain unrecovered. Encoded stream 90 is accepted as input to video decoder stage 84. Video decoder stage 84 decodes encoded stream 90 in accordance with the video encoding method used by transmitting station to generate an output video that is suitable for rendition on a display (not shown), which may be a peripheral to receiving station 14.

Video decoder stage 84 also generates as output a video property signal 92 which is accepted as input by retransmission selector stage 86. Video property 92 includes decode state information as well as video properties, which can include any property of the rendered video such as for example play-back rate. Retransmission selector stage 86 also accepts as input recovered media packets 81 (or in some cases just the packet header data of recovered media packets 81) from FEC decoder 80 and NACK list 85 from NACK list generator stage 88. As explained below in more detail, retransmission selector stage 86 determines which, if any packets originally included in packetized output signal 78 have been lost and are missing from media packets 81 and determines whether to request retransmission of those lost packets. If it is determined if to request retransmission of a lost packets then retransmission selector stage 86 generates as output a NACK or other retransmission request 94. Retransmission request 94 is transmitted via network 16 to transmitting station 12.

Back at transmitting station 12, retransmission request 94 is received as input to retransmission logic stage 70. As mentioned above, retransmission logic stage 70 also receives as input the packetized output signal 78 generated by FEC encoder stage 68. Other inputs can be accepted by retransmission logic stage 70 including inputs pertaining to the state of network 16. As described below, retransmission logic stage 70 determines whether to accept retransmission request 94. If retransmission logic stage 70 determines to accept retransmission request 94, then it generates as output retransmitted packets 96 which are retransmitted to receiving station 14 via network 16. Retransmitted packets 96 can optionally be protected with FEC coding.

Figure 6:
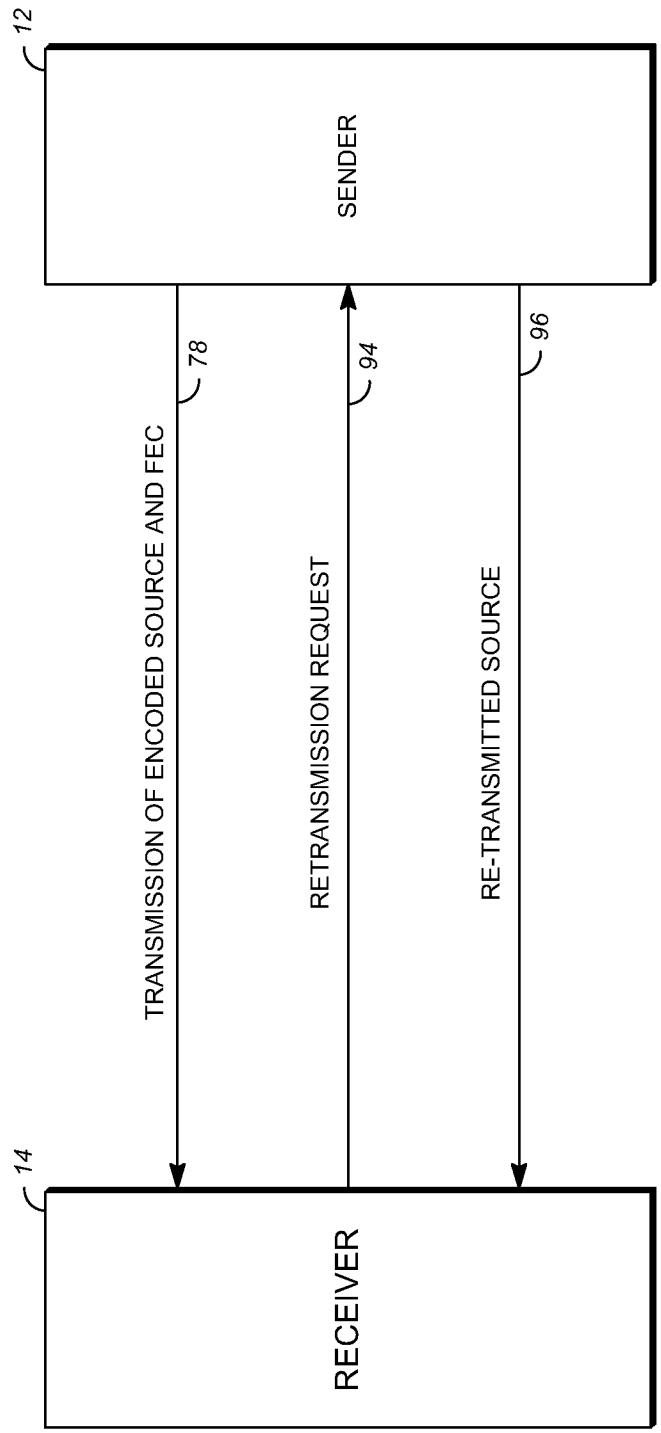
FIG. 6 is a schematic diagram showing the sequence of messages exchanged between transmitting station and receiving station of FIGS. 1 and 5.

FIG. 6 is a schematic diagram summarizing showing the sequence of messages exchanged between transmitting station and receiving station as described above in connection with FIG. 4. Packetized output signal 78 is transmitted from transmitting station 12 to receiving station 14. Receiving station 14 can transmit a retransmission request 94 to transmitting station 12. Transmitting station 12 can retransmit the requested packets 96.

Using FEC Data to Determined Packet Loss State Information

The operation of the NACK list generator 88 is explained in reference to exemplary transmissions of packetized video data as shown in FIGS. 7, 8A, 8B, 9A, 9B, 10A and 10B. These exemplary transmissions are first explained, and then discussion will be made of the operation of NACK list generator stage 88 relative to these examples. In one illustrative embodiment, NACK list generator stage 88 uses information embedded in the FEC packets received in packetized output signal 78 to better determine packet loss state.

FIG. 7 is schematic diagram of an exemplary FEC packet header 100. In this case, the illustrative packet header is as defined in RFC 5109. The FEC header sits below the RTP header that is contained in every packet (source or FEC). The RTP header contains the packet sequence number and the frame time-stamp. Exemplary FEC packet header 100 includes various fields such a base sequence number field 102 containing a base sequence number, and mask field 104 containing a mask. Exemplary FEC packet header 100 also includes a time-stamp recovery field 106 that is the XOR of the time-stamps of the media packets used in the FEC packet mask. The base sequence number contained in base sequence number field 102 is the packet sequence number of the first packet of source packets to which the FEC packet is applied, and is explained below in connection with FIGS. 10A and 10B. As explained above in connection with FIG. 4, the packet mask contained in mask field 104 is a sequence of bits (such as 16 or 48 bits) that defines the mask to be used by FEC decoder stage 80 of receiving station 14 to recover missing source packets.

Figure 8A:
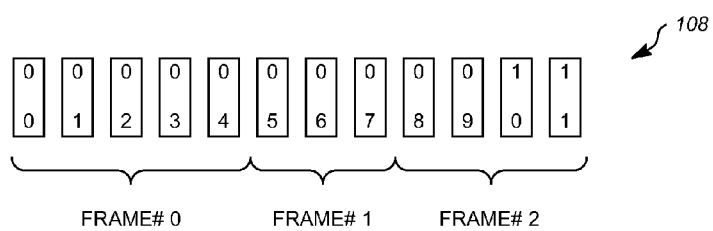
FIG. 8A is a schematic diagram of a portion of packetized video data transmitted without FEC coding over the communications system of FIG. 1.
Figure 8B:
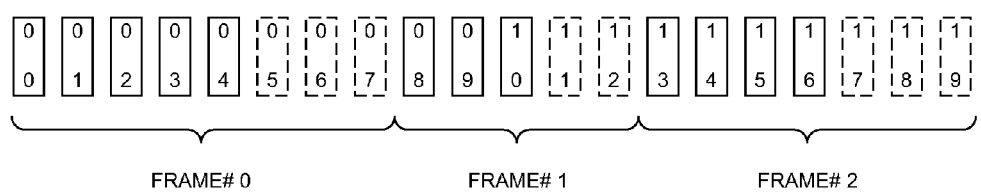
FIG. 8B is a schematic diagram of a portion of packetized video data transmitted with FEC coding over the communications system of FIG. 1.

FIGS. 8A and 8B are schematic diagrams of portions 108 and 110, respectively, of packetized output signal 78 transmitted over the communications system 10 of FIG. 5. Individual packets in the FIGS. 8A and 8B (as well as 9A, 9B, 10A and 10B) are depicted as boxes. Packets are further distinguished in the drawings by their respective packet sequence number shown within the boxes representing each packet. In practice, the frame number for each packet is in the RTP header for the packets (typically in the time stamp field). To distinguish packet sequence numbers in the drawings from other reference numbers in the drawings, packet sequence numbers herein are referred to in quotation marks. For convenience, packets are sometimes referred to herein by the packet sequence number (e.g., packet "07"). Packets are also associated with video frames, which are depicted in the drawing by the legends Frame 00, Frame 02 and Frame 03. Although not shown in the figure, every packet (source or FEC) contains, within its RTP header, the time-stamp of the frame, so every received packet is associated to a frame via the time-stamp field. The frame index "02" for example may denote the frame time-stamp.

Referring to FIG. 8A, portion 108 consists only of source packets (legend in the drawings as packets "00" through "11"); no FEC encoding is used in this example to generate portion 108. In this example, all of source packets have been received by receiving station. None were lost during transmission. Source packets in portion 108 include data for three frames of video, namely Frame 00 (source packets "00" through "04"); Frame 01 (source packets "05" through "07"); and Frame 02 (source packets "08" through "11").

Referring to FIG. 8B, portion 110 consists of both source packets (shown in solid lined boxes) and FEC packets (shown in dotted lined boxes). FEC encoding has been used in this example to generate portion 110. In this example, all of the packets in portion 110, including both source packets and FEC packets, have been received. None were lost during transmission. Source packets in portion 110 include data for three frames of video, namely Frame 00 (source packets "00" through "04" and FEC packets "05" through "07"); Frame 01 (source packets "08" through "10" and FEC packets "11" and "12"); and Frame 02 (source packets "13" through "16" and FEC packets "17" through "19").

Figure 9A:
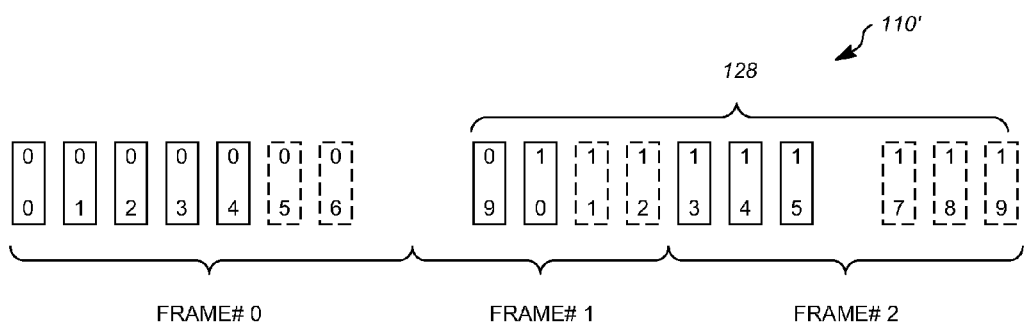
FIG. 9A is a schematic diagram of the portion of packetized video data shown in FIG. 8B in which a first set of packets has been lost during transmission over the communications system of FIG. 1.
Figure 9B:
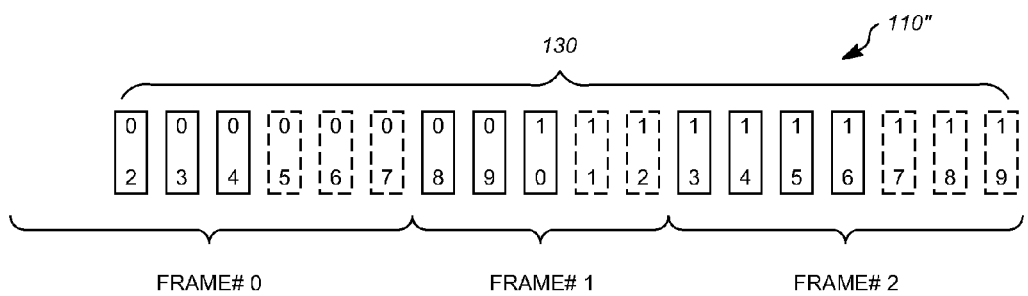
FIG. 9B is a schematic diagram of the portion of packetized video data shown in FIG. 8B in which a second set of packets has been lost during transmission over the communications system of FIG. 1.

FIGS. 9A and 9B are schematic diagrams of the portions 110' and 110" of packetized output signal 78 in which sets of packets have been lost during transmission over communications system. The packets shown in FIGS. 9A and 9B are further distinguished by their respective packet sequence numbers shown within the boxes representing each packet. Referring to FIG. 9A, portion 110' is identical to portion 110 of FIG. 8B except that in portion 110' of FIG. 9A, packets "07" and "08" (shown in FIG. 8B) have been lost during transmission of packetized output signal 78 from transmitting station 12 to receiving station 14. In this example, lost packet "07" is an FEC packet included at the end of Frame 00. Lost packet "08" is a source packet at the beginning of Frame 01.

Referring to FIG. 9B, portion 110" is identical to portion 110 of FIG. 8B except that in portion of FIG. 9B, packets "00" and "01" (shown in FIG. 8B) have been lost during transmission of packetized output signal 78 from transmitting station 12 to receiving station 14. In this example, lost packets "00" and "01" are consecutive source packets including at the beginning of Frame 00.

The base sequence number field (FIG. 7) is now explained in general terms. An FEC packet such as packet "07" of FIG. 8B is applied to a number of source packets such as source packets "00" through "04" of FIG. 8B. The FEC packet includes a packet mask such as mask 50 depicted in FIG. 4. The mask is a row of bits that specifies the linear combination of source packets to generate an FEC packet (see discussion above accompanying FIG. 4). The linear combination is applied over the protected source packets by a byte-wise XOR. This same mask information is used by a decoder such as FEC decoder 80 (FIG. 5) to perform a recovery operation. Thus, each FEC packet can apply to (or in the parlance of the relevant art, "protect") a series of source packets that contain the underlying video data of a particular frame. The base sequence number field 102 (FIG. 7) in the FEC packet contains the number of the first packet of source packets to which the FEC packet is applied. Thus, each "one" value in the FEC packet mask corresponds to a protected source packet, and therefore their cardinality indicates the lower bound of the number of source packets in the protected frame.

Figure 10A:
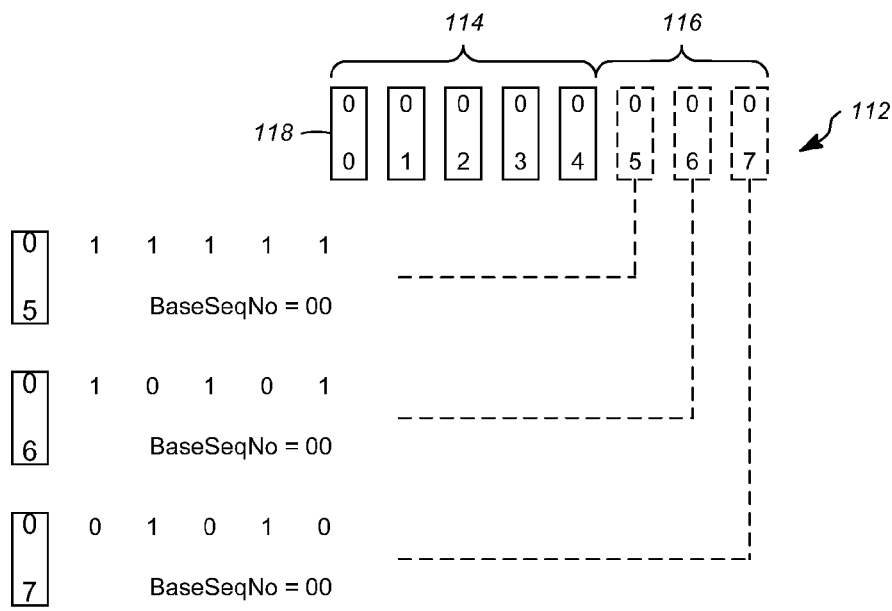
FIG. 10A is a schematic diagram of a portion of packetized video data transmitted with FEC encoding using an equal protection implementation.
Figure 10B:
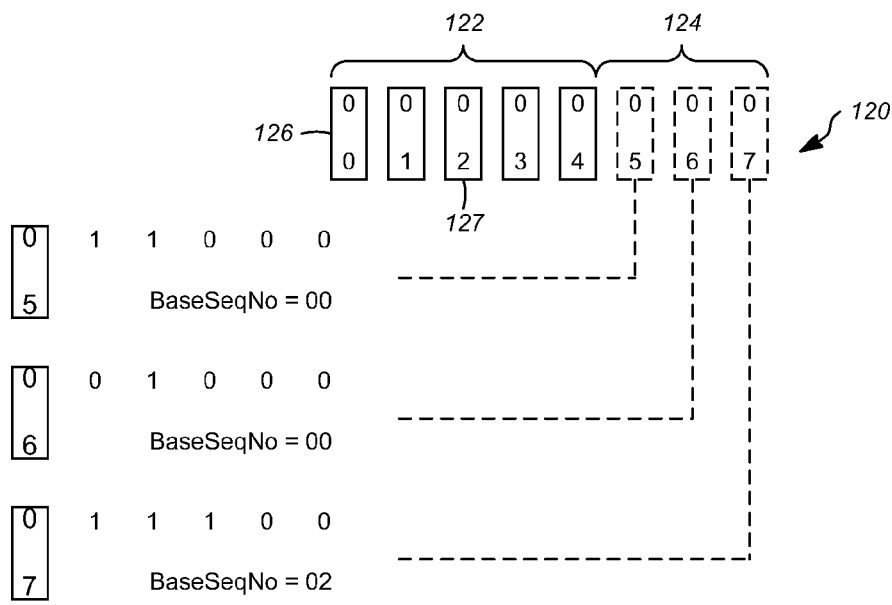
FIG. 10B is a schematic diagram of a portion of packetized video data transmitted using an unequal protection implementation.

In some exemplary embodiments, there are two implementations of base sequence numbers, namely equal protection (illustrated in FIG. 10A) and unequal protection (illustrated in FIG. 10B). For the case of unequal protection, it can be assumed in some cases, without loss of generality, that the first partition is the important part of the encoded frame, and the remaining partition(s) are less important. Generally speaking, in the equal protection implementation, the FEC packets associated with a particular frame of video data protect all of the packets equally in that frame. In the unequal protection implementation, a group of one or more FEC packets protect all or most of the first partition packets, while the remaining FEC packets, if any, will protect all of the remaining packets containing the subsequent partitions. With unequal protection, the first partition is protected more heavily than the remaining partitions. The relevance of the partitions for the unequal protection case make it useful to use the base sequence number field (in the FEC packet header) to indicate the partition boundary. In the example of FIG. 10B, should one FEC packet protecting the first partition be lost, there is still a chance that another FEC packet protecting the first partition will be successfully transmitted, thus permitting the first partition to be completely recovered. Furthermore, if the receiver also receives the FEC packet 07, the receiver can deduce, from the 02 value of the base sequence number contained in FEC packet 07, that the first partition is composed of 2 packets. Unequal protection can leave some partitions with less protection, but can be advantageous when the successful decoding of the frame depends more heavily on the integrity of the first partition than subsequent partitions. For example, the first partition might contain information used to decode subsequent partitions. Therefore, its loss or corruption might have an especially deleterious effect on the quality of the decoded frame.

FIGS. 10A and 10B are schematic diagrams of portions 112 and 120 of packetized output signal 78 transmitted over the communications network 10. Referring to FIG. 10A, portion 112 consists of both source packets 114 (shown in solid lined boxes) and FEC packets 116 (shown generally as dotted lined boxes). Packets 114 and 116 are further distinguished by the values of their packet sequence numbers, shown within the boxes representing each of packets. FIG. 10A also diagrammatically illustrates the value of the mask and base sequence numbers of each of FEC packets 116. The mask and base sequence numbers of FEC packets 116 are:

TABLE 1

| FEC Packet | Mask | Base Sequence Number |
|---|---|---|
| "05" | "1 1 1 1 1" | "00" |
| "06" | "1 0 1 0 1" | "00" |
| "07" | "0 1 0 1 0" | "00" |

Because all of FEC packets 116 illustrated in FIG. 10A have the same base sequence number (i.e., "00") and a five-bit mask, it is the case that they pertain to the same group of source packets, namely the source packets 114 starting with source packet 118 (which as indicated in FIG. 10A has a packet sequence number of "00"). The implementation of FIG. 10A is one example of equal protection because all of source packets 114 are protected by two FEC packets 116. That is, in the equal protection case, each of the source packets is protected by the same number of FEC packets. For example, FEC packet "05" protects source packets "00", "01", "02", "03" and "04", FEC packet "06" protects source packets "00", "02" and "04" and FEC packet "07" protects source packets "01" and "03". The mask bits determine which of the source packets following the base sequence number will be protected by a particular FEC packet.

Referring to FIG. 10B, portion 120 consists of both source packets 122 (shown in solid lined boxes) and FEC packets 124 (shown as dotted lined boxes). Packets 122 and 124 are further distinguished by the values of their packet sequence numbers, shown within the boxes representing each of packets. FIG. 10B also diagrammatically illustrates the value of the mask and base sequence numbers of each of FEC packets 124. The mask and base sequence numbers of FEC packets 124 are:

TABLE 2

| FEC Packet | Mask | Base Sequence Number |
|---|---|---|
| "05" | "1 1 0 0 0" | "00" |
| "06" | "0 1 0 0 0" | "00" |
| "07" | "1 1 1 0 0" | "02" |

FEC packets 124 exemplify unequal protection because the source packets "00" through "04" are protected by differing numbers of FEC packets 124. In particular, two of FEC packets 124 (containing the packet sequence numbers "05" and "06") each contain a base sequence number of "00" and a five-bit mask which includes that FEC packet "05"

protects source packets "00" and "01" and FEC packet "06" protects only source packet "01". The remaining one of FEC packets 124 (packet "07") has a base sequence number of "02" and a five bit mask which indicates that FEC packet "07" protects "02", "03" and "04". Summarizing, source packet "01" is protected by one FEC packet ("05"), source packet "02" is protected by all three FEC packets, source packet "03" is protected by two FEC packets ("06" and "07") and source packets "03" and "04" are protected by one FEC packet ("07"). This type of base sequence number setting can be used to let receiving station 14 determine, in some cases, the number of packets of the first partition. For example, if FEC packet 07 is received, and at least one of FEC packet 05 or 06 (or the receiver knows by some other means that the first packet sequence number is 00), then the receiver can deduce that there are 2 first partition packets (base sequence number 02—base sequence number 00).

Operation of the NACK list generator stage 88 (FIG. 5) will now be further explained with continuing reference to FIGS. 9A and 9B. NACK list generator stage 88 generates the list of missing packets that the selector will consider for re-transmission request (e.g., NACK list 88). In some cases, NACK list generator 88 can use embedded FEC data in the FEC header to resolve ambiguities of the missing packet state, e.g., regarding which and how many packets are lost. NACK list generator stage 88 accepts as input the FEC header data 83 (in particular, the FEC header data refers to the time-stamp and sequence number of received FEC packets, and the base sequence number and the packet mask of the received FEC packets) generated as output by FEC decoder stage 80 and the packet header data included in the recovered media packets 81 generated as output by FEC decoder stage 80. NACK list generator stage 88 analyzes the content of these packets to derive information about the number and type of loss packets. This information is useful in determining a more complete packet loss state.

FIG. 9A, as explained above, illustrates portion 110' of packetized output signal 78 in which packets having packet sequence numbers "07," "08" and "16" (as shown in FIG. 8B) have been lost during transmission. For purposes of this example, portion 110' is encoded using equal protection. Receiving station 14 lacks information as to whether lost packets "07" and "08" are FEC packets or source packets or as to which frame the packets belong. The NACK list generator state 88 uses the sequence numbers and time-stamps of the received packets (contained in the RTP packet header of every packet) and the FEC header data of the received FEC packets (from packets that were successfully transmitted in packetized output signal 78) to determine whether the lost packets are source packets or FEC packets and to determine the frames to which the lost packets likely belong.

For example, NACK list generator stage 88 searches portion 110' for packets, 128 that were received in portion 110' and that have packet sequence numbers that are higher than the packet sequence numbers of the missing packets "07" and "08." NACK list generator stage 88 scans packets 128 for base sequence numbers that fall within the range of the packet sequence numbers of the missing packets (i.e., "07" and "08"). In this example, NACK list generator stage 88 determines that one FEC packet 128 (specifically, packet "11") has a base sequence number equal to "08". It can thus be determined that missing packet "08" is a source packet, and it is the first packet of a frame (because it corresponds to the base sequence number). The NACK list generator 88 also determines that FEC packet "11" belongs to Frame 01 (this information is also in the FEC packet's header via the frame time-stamp data). Because FEC packet "11" belongs to Frame 01, the NACK list generator stage 88 can also determine that missing packet "08" belongs to Frame 01. With the state of the missing packet "08" resolved, the NACK list generator 88 can determine that the preceding missing packet (i.e., the missing packet with packet sequence number "07") belongs to the preceding frame, Frame 00, because missing packet "07" precedes the first packet ("08") in Frame 01. Because FEC packets in this case are grouped together at the end of each frame, it can be further determined that missing packet "07" is also an FEC packet because the packet ("06") that immediate proceeds packet "07" is itself an FEC packet.

The operation of NACK list generator stage 88 is further explained by way a second example in reference to FIG. 9B. FIG. 9B, as explained above, illustrates portion 110" of packetized output signal 78 in which packets having packet sequence numbers "00," and "01" (as shown in FIG. 8B) have been lost during transmission. For purposes of this example, portion 110" is encoded using equal protection. Receiving station 14 does not know whether lost packets "00" and "01" are FEC packets or source packets or to which frame the packets belong. NACK list generator stage 88 can use packet header information from packets that were successfully transmitted in packetized output signal 78 to determine whether the lost packets are source packets or FEC packets and to determine the frame to which the lost packets likely belongs.

For example, NACK list generator stage 88 searches portion 110" for packets 130 that were received in portion 110" and that have packet sequence numbers that are higher than the packet sequence numbers of the missing packets (i.e., "00" and "01"). NACK list generator stage 88 scans packets 130 for base sequence numbers that fall within the range of the packet sequence number of the missing packets "00" and "01". NACK list generator stage 88 determines that packet "05" has a base sequence number of "00". It can thus be determined that missing packet "00" is a source packet (because it corresponds to the base sequence number) and also the first packet of frame 00, since the NACK list generator stage 88 also determines that FEC packet "05" belongs to Frame 00 (this information is also in the FEC packet's header via the frame time-stamp). By further inspecting the mask of FEC packet "05," NACK list generator stage 88 can determine whether the next missing packet ("01") is also a source frame packet. For example, in this case the mask value of FEC packet is "1 1 1 1 1" (as shown in FIG. 10; it should be noted that this mask value is an arbitrary example for purposes of illustration). It will be recalled that the mask in an FEC packet identifies by the presence of a "one" value which source packets (relative to the packet at the base sequence number) are protected by the FEC packet. For example, a mask with a value "1 1 1 1 1" means that the FEC packet protects five consecutive packets (starting with the packet whose packet sequence number is equal to the FEC packet's base sequence number). Therefore, it can be determined in this example that the five consecutive packets (starting with packet "00") are all source packets (because they are protected by FEC packet "05"). In some embodiments, even if the mask value were "1 0 0 0 1" it could still be determined that that the five consecutive packets (starting with packet "00") were source packets because the $5^{th}$ most significant bit in the mask is a "one." In some embodiments, where an FEC packets protects two or more packets in a range of contiguous source packets, it can be determined from the mask value, for example "1 0 0 0 1" that all five continuous packets (starting with the packet whose packet sequence number is the base packet sequence number) are source packets.

As exemplified above, a packet mask can be used to determine a lower bound on the number of packets in the frame. The lower bound of the frame packet number (n) is determined as the $n^{th}$ most significant bit of the FEC packet. From all the FEC packets received for the same frame (i.e., all FEC packets with same time-stamp), receiving station 14 will take the largest n value as the lower bound on frame packet number. This quantity is very useful for NACK list generation, and for estimating the distortion of the incomplete frame.

Thus, by inspection of the header information of those FEC packets that are successfully transmitted, NACK list generator stage 88 can deduce with some degree of confidence (although, in some cases, not absolute certainty) whether missing packets are FEC or source packets to which frame or the missing packets belong, whether the missing packet is the first packet of the frame, and lower bound of the number of packets in the frame. Furthermore in the case of unequal protection, the number of packets for the first partition may also be deduced (e.g., FIG. 10B) from the base sequence number setting. NACK list generator stage 88 outputs NACK list 85 including information representing its finding as to which missing packets are likely to be source or FEC packets and the frames or partitions to which the missing packets belong. As discussed below, this output of NACK list 85 is accepted as input by retransmission selector 86 and can be used (along with or in lieu of other inputs) to selectively request retransmission of missing packets.

Figure 11:
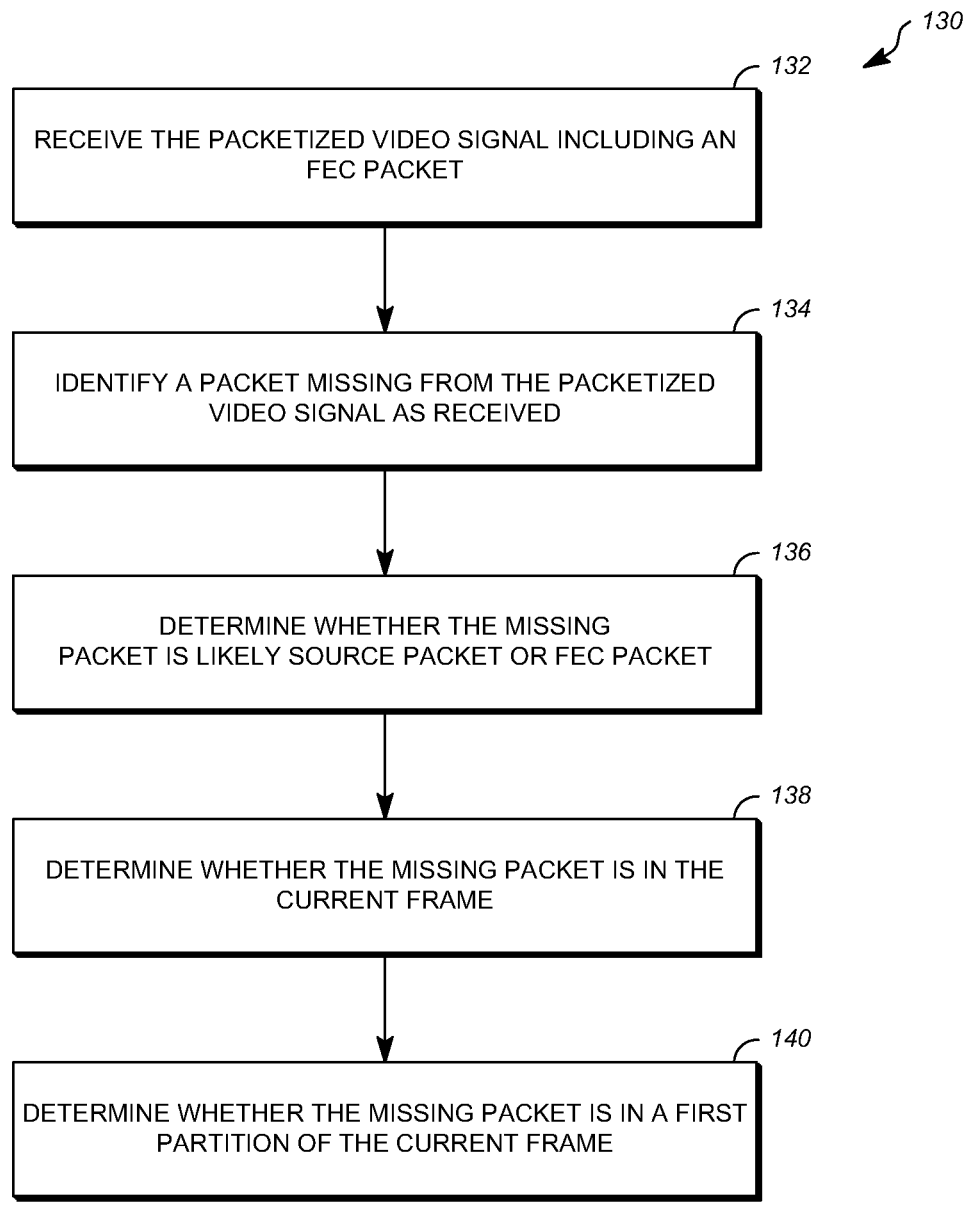
FIG. 11 is a logic flow chart illustrating the operation of the receiving station of FIGS. 1 and 5.

FIG. 11 is a logic flow chart showing the generalized operation 130 of NACK list generator stage 88 in regard to its assessment of missing packets. At a block 132, receiving station 14 receives packetized video data in the form of packetized video output 78. The packetized video data may include at least one of the FEC packets. At a block 134, receiving station 14 identifies one or more missing packets in the packetized video signal as received by receiving station. At block 136, receiving station 14 determines whether the missing packets are likely source packets or FEC packets. This determination is made using the techniques described above based on the base sequence number and packet mask of the received FEC packets. At a block 138, receiving station 14 determines whether the missing packet is in the same encoded frame as the FEC packet using the techniques described above based on at least one of the base sequence number or the packet mask of the FEC packet. At a block 140, receiving station 14 determines whether the missing packet is a first, second or other partition, in those cases where the encoded frame is partitioned and FEC packets are applied with unequal protection In one embodiment, the processing of steps 134 through 140 can be performed at the NACK List generator stage 88.

Selective Re-Transmission Based on Video Content and Network State

Referring to FIG. 5, the operation of retransmission selector stage 86 is now described in more detail.

Generally speaking, retransmission selector stage 86 is designed to request retransmission of packets by balancing the cost of a delay of the retransmission against the benefit of reduced distortion. The delay-distortion cost function can be applied to the whole frame to do selective retransmission at the frame level, or may be applied at the packet level for selective retransmission of a subset of missing packets. Retransmission logic of a different form has been employed in some conventional video systems. Such systems accept as inputs only the network state parameters such as round-trip time ("RTT") and play-back time ("PB") of the video renderer. For example, if RTT is low and PB is large, then retransmission can be requested (since ample time is available for the play-back). However, in some applications such as real-time video conferencing, play-back time is usually small. Conventional retransmission approaches not necessarily use selective re-transmission and do not always yield good results.

In one exemplary embodiment, retransmission selector stage 86 determines whether to request transmitting station 12 to re-transmit lost packets based on an assessment that considers the cost of the retransmission delay and the quality of decoding partial frames. Still referring to FIG. 5, retransmission selector stage 86 accepts as input the output of FEC decoder stage 80 (in the form of recovered media packets 81), the output of NACK list generator stage 88 (in the form of a NACK list 85) and the output of video decoder stage 84 (in the form of video properties and decoder state signal 92). NACK list generator 88 can include in its output of NACK list 85 embedded dated extracted from FEC encoder data 83 and recovered packet header data included in recovered media packets 81. Such embedded data can indicate, for example, more complete or accurate packet loss state information by identifying which lost packets are source packets (versus FEC packets), which lost packets belong to which frame, and which packets if any belong to a first partition of the frame versus subsequent partitions (such as can be determined when unequal protection is implemented).

From these inputs, retransmission selector stage 86 can derive one or more different types of information that it uses to determine whether to request retransmission of missing packets. For example, retransmission selector stage 86 can incorporate in its decision-making logic video content state information derived from the content of the video signal itself, including video resolution, an estimate of the encoding rate (from the average size of decoded frames, content classes) or frame type (e.g., key or delta frame).

Other types of information which can be derived from inputs recovered media packets 81, FEC header data 85 and video properties 92 by retransmission selector 86 include packet loss state. Packet loss state information can include one or more parameters such as:

N: estimate of the total number of source packets in the current frame
M: estimate of the number of missing/lost packets
P: relative importance score for each missing packet The relative importance score (P) for each missing packet can be based on the type of data contained in the packet. For example, a packet containing data from the first partition (which may include motion vectors and other relatively more important data) can be assigned a higher importance score. The relative importance score of the packet can also be a function of the type of frame, with reference frames affording their packets a higher importance score. The specific values used in the importance score will depend on particular implementations. In one implementation, the relative importance score P may be computed as a distortion value (as in Equation 2) computed on a per-packet basis. The importance score may be computed based on offline-computed empirical data.

Error concealment (EC) knowledge is another type of information that can be used by retransmission selector 86. Both sending station 12 and receiving station 14 are aware of the error concealment (EC) algorithm used by the decoder. This awareness may be used in estimating the quality degradation to the decoded frame which would result from the packet loss state. The packet loss cost function may be conditioned, for example, on whether the EC is effective at recovering motion vectors (first partition data), or residual data (second or higher partition data). This effectiveness may in turn be a function of the number or percentage of missing packets in the frame, the frame's resolution and the frame type (e.g., key or delta frame). An additional variant can be the state of the decoder (e.g., whether or not the previous frame was decoded successfully, as this would impact the quality of the recovered frame), which is related to error propagation discussed below.

Error propagation (EP) potential is another exemplary type of information that retransmission selector 86 can use to decide whether to request retransmission of a missing packet. Error propagation potential refers to the potential of a missing packet to affect the propagation of errors in later transmitted frames. For example, packets of reference frames may be considered to have higher error propagation potential than non-referenced frames.

Model Description

In some cases, information used by retransmission selector 86 is acquired through inspection of at least one of the three inputs depicted in FIG. 5 (i.e., recovered media packets 81 (including packet header data of recovered media packets), FEC header data 83, (embedded data contained in the NACK list 85) and video properties 92. One, some or all of these inputs can be used in a cost function (J) that is a basis for determining when to request retransmission of lost packets. In one application, the cost function J can be based on a trade-off between the estimated degradation in the perceived quality and the delay (as a consequence of the retransmission).

Cost function J can be applied on missing packets across a frame to determine whether to request missing packets. If the number of missing packets is sufficiently large so as to raise network congestion then the cost junction J can be applied again on a packet-by-packet basis to select a subset of the missing packets for re-transmission (e.g., to request selective re-transmission of packets at a frame or packet level).

In one exemplary embodiment, the cost function (J) employed by retransmission selector stage 86 is determined as follows:

$$J=D+\lambda Q \quad \text{(Equation 1)}$$

where D is defined as the estimated distortion due to the missing packets, Q is defined as the acceptable delay (that is, delay as a function of RTT and PB, i.e., Q=F(RTT,PB)), and λ is defined as a weight that controls the trade-off between the distortion and delay. Thus, the retransmission of packets is requested if J exceeds a threshold. Note that the calculation of J, D and Q as described herein are illustrative examples only. In one embodiment, Q can be represented by describe values as follows:

TABLE 3

| Classes | Representing Values |
| --- | --- |
| {Low, Medium, High} | {0, 1, 2} |

An example for the determination of the estimated distortion D is now provided. In one application D is a function of two distortion components:

$$D=Dc+Ds \quad \text{(Equation 2)}$$

where Dc is the estimated distortion of the current frame (error recovery), and Ds is the estimated impact on distortion on subsequent frames (error propagation).

In some cases, Dc can be based on at least one or more of the types of input, such as the type of error concealment algorithm used decoder, video properties (e.g., content, resolution, bit rate) and packet loss state information derived from recovered media packets 81 and embedded data in the FEC header data 83. In addition, Dc may be further estimated using knowledge regarding the quality of previous frames. For example, the computation of Dc can be based on whether the previous frame was complete (because in such cases, the EC algorithm may perform better).

In another alternative embodiment, Dc can be determined using state variables in accordance with the following:

$$Dc=Dc\ F(P,bpp,Dc_{\{t-1\}}) \quad \text{(Equation 3)}$$

Where Dc is defined as a function F of P, the packet loss state, bpp which represents bits per pixel and $Dc_{\{t-1\}}$) which is the decoder distortion state of the previous frame. The bits per pixel is based on an estimated of the encoding rate and the resolution of the video, as determined from the video properties 92.

The value of D can be output using a predetermined error distortion classification scheme such as described in Table 4 below:

TABLE 4

| Distortion | Classes | Representing Values |
| --- | --- | --- |
| Distortion - current frame (Dc) | {Bad, Poor, Acceptable, Good} | {0, 1, 2, 3} |
| Distortion - Subsequent frames (Ds) | {Non-ref, Partial, Full} | {0, 1, 2} |

In some case, Ds reflects the error propagation potential of a given packet. In a predicted-encoding scheme such as H.264 or VP8, the decoding of a given frame can affect the quality of subsequently decoded frames. The Ds score in some case captures the probability that a packet will be referenced. This probability can be estimated by first determining whether the current frame to which the packet belongs is a reference frame. The information as to whether the current frame is a reference frame is included in the video properties input accepted by retransmission section stage from video decoder stage 84. This frame type information can also be included in the codec header contained in some packets. In one implementation, Ds will be set to 0 (Null) if the frame is a non-reference frame, 1 (Partial) if it is a delta frame and 2 (Full) if it is a key frame.

Thus, with packet loss state information available (and having knowledge of the error concealment algorithm's capabilities), retransmission selector stage 86 can, for a particular packet or group of missing packets determines whether or not to request retransmission by assessing how well video decoder stage 84 will be able to minimize distortion if the packet or group of packets is missing.

In one embodiment, a determination is made as to whether the missing packets fall into partitions and if so how many missing packets fall into the first partition and how many fall into the second or higher partitions. If the number of packets missing from the first partition is greater than zero, then a determination of the Dc score is made for those packets based on how effective the decoder's error concealment algorithm is at recovering from first partition errors given the number of number of missing packets in the first petition. The determination can be based on empirical testing and can vary from implementation to implementation. If the number of packets missing from the second and higher partition is greater than zero, then a determination of Dc is made for those packets based on how effective the decoder's error concealment algorithm is at recovering from two or more partition errors given the number of missing packets in the first petition. The determination can be based on empirical testing and can vary from implementation to implementation.

The quality of the decoded frame given the packet loss state can depend on the video content state. Video decoder stage 84 has access to this basic information, in some cases without incurring significant additional processing. For example, from past coded frames, decoder can extract the following: video resolution, an estimate of the encoding rate (from average size of decoded frames), content classes and other video properties which are output from decoder to retransmission selection stage.

In one exemplary embodiment, a look up table is used to determine whether to request retransmission based on given values of Dc and Ds and the acceptable delay. One such table is illustrated as Table 5 below. In Table 5, the inputs are the values of Dc and Ds as indicated in the rows of the table and the acceptable delay as indicated by the three columns under the heading "acceptable delay." The output is indicted by the legend "Y" for request retransmission and "N" for do not request retransmission. For example, referring to the first row of Table 5, if the value of Dc is 0, and the value of Ds is 0, then the output for any level of acceptable delay (i.e., high or medium) is "N".

TABLE 5

| Distortion | | Acceptable Delay | |
|---|---|---|---|
| Dc | Ds | High | Medium |
| 0 | 0 | N | N |
| 1 | 0 | N | N |
| 2 | 0 | Y | N |
| 3 | 0 | Y | Y |
| 0 | 1 | Y | N |
| 1 | 1 | Y | Y |
| 2 | 1 | Y | Y |
| 3 | 1 | Y | Y |
| 0 | 2 | Y | Y |
| 1 | 2 | Y | Y |
| 2 | 2 | Y | Y |
| 3 | 2 | Y | Y |

In an alternative embodiment, retransmission logic is also included in retransmission logic stage 70 of transmitting station 14. Retransmission logic stage 70 accepts as input a request from retransmission selector stage 86. Additional decision processing can take place at retransmission logic stage 70 before fulfilling the request. For example, retransmission logic stage 70 can determine the congestion of network 16. If congestion is determined to be high, then retransmission logic stage 70 can provide only a subset of the packets that are included in the retransmission request 94. Retransmission logic stage 70 can also determine if any requested packets are non-source packets and then refrain from retransmitting those packets.

In another alternative embodiment, the selective retransmission logic employed by retransmission selector stage 86 can be implemented in two stages. A first stage assesses cost function J for all packets at a frame level. The second stage then assesses the cost function J for individual packets within the frame. This two-stage approach is useful in when a frame is missing several packets and it is desired to reduce the number retransmitted packets to reduce network congestion.

In yet another embodiment, the selective retransmission based on the distortion-delay cost function is supplemented with a waiting time parameter. Once the retransmission selector 86 makes a decision on which packets in the NACK list to be sent to the sender for retransmission, the receiver may decide to wait only up to the time and then decode the (possibly incomplete) frames, regardless of whether all the missing packets have been received. The parameter may be fixed or determined dynamically based on the various factors, such as the packet inter-arrival jitter, round-trip time, and frame rate of incoming video stream for example. The relevance of this waiting time parameter may be for cases where the re-transmitted packets are further delayed due to sudden increases in network congestion or cross-traffic.

Figure 12:
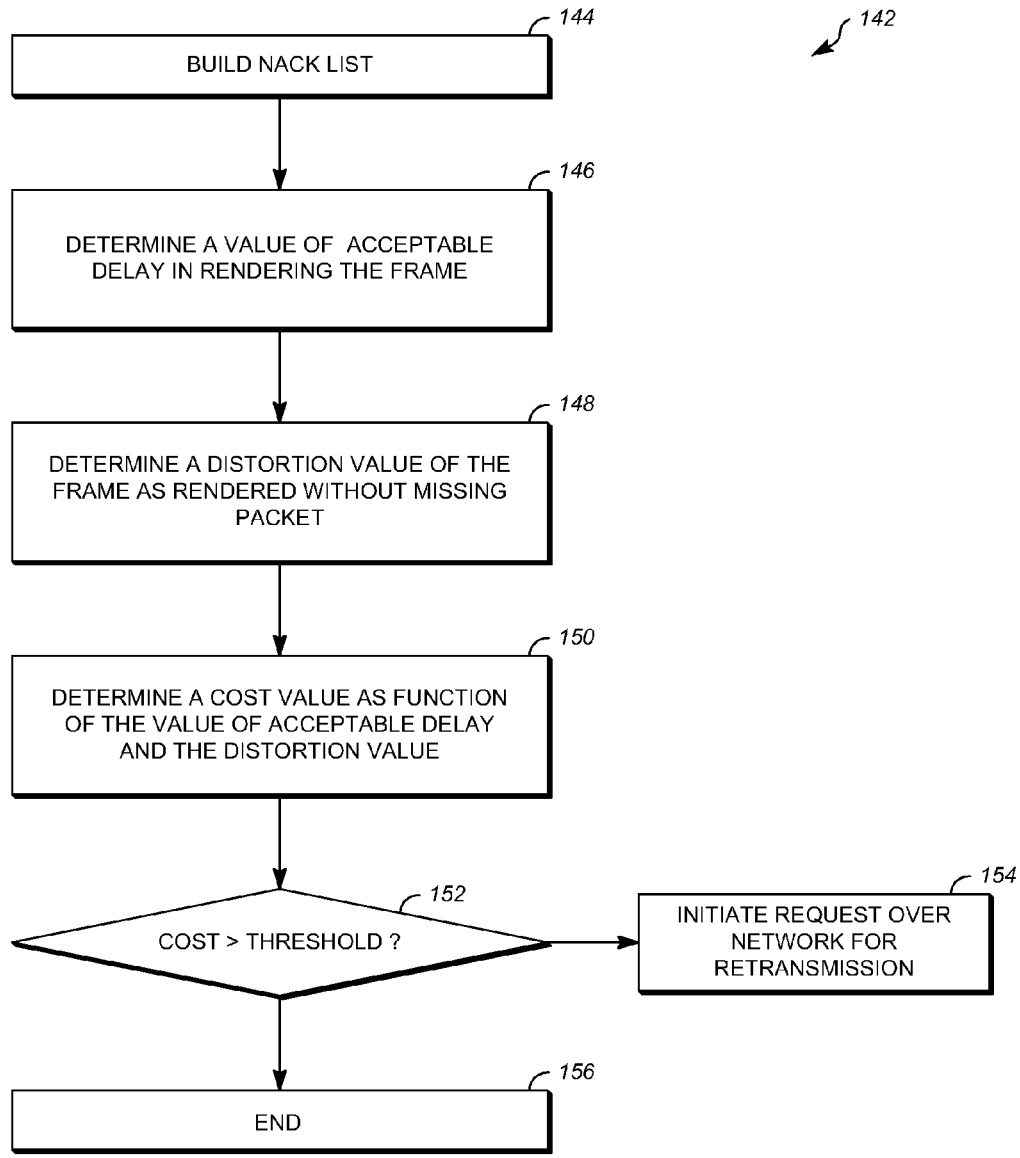
FIG. 12 is a logic flow chart illustrating the operation of the retransmission selector stage of the receiving station of FIGS. 1 and 5.

Referring to FIG. 12, a logic flow chart is provided illustrating the operation 142 of selective retransmission stage 86. At a block 144, a NACK list (such as NACK list 85) is built. In the foregoing embodiment, this can be accomplished by NACK list generator stage 88. The information used by NACK list generator stage 88 to build the NACK list includes embedded FEC data (such as packet masks and base sequence numbers that are derived from the FEC header data 83) and RTP packet header data included in the recovered media packets 81 and FEC packets 83 (such as timestamps, sequence numbers, and marker bits).

At block 146, retransmission selector 86 determines a value of acceptable delay (such as for example Q) in rendering the frame. This can be accomplished using the values of PB and RTT, for example, as described above.

At block 148, retransmission selector 86 determines a distortion value (such as for example D) of the frame as rendered without the at least one missing packet. In one embodiment, the process of determining a distortion value begins by extracting a packet loss state, such as the total number of packets in the frame and the number of missing packets and their affiliation (such as partition information). Next, the value of Dc is determined as described above. In some cases, the value of Dc is determined based on the packet loss state and the decoding state of previous frames. Dc can in some cases be a value as set forth above in Table 4.

Processing at block 148 can also include determination of a Ds value, which can be performed as described above. The value of Ds can in some cases be a value as set forth above in Table 4. In one implementation, the Ds value can be based on the packet loss state. In alternative embodiments, Ds can be determined based on the current frame type in accordance for example with Table 6 below:

TABLE 6

| Frame Type | Classification |
|---|---|
| Key Frame | Full |
| Delta Frame | Partial |
| Non-reference (Delta) Frame | Non-ref |

At a block 150, retransmission selector 86 determines a cost value (such as for example J) as function of the value of acceptable delay Q and the distortion value D.

At decision block 152, if the cost value J exceeds a threshold, then at a block 154 receiving station 14 initiates a request over the network for retransmission of the at least one missing packet; processing then terminates at a block

156. If at decision block 152, the cost value does not exceed the threshold, then processing terminates at block 156 without requesting retransmission.

Alternatively, the decision to retransmit can be based on the results of a pre-calculated look-up table (such as Table 5 above). Such a table can incorporate user-preferences to determine the optimal trade-off between delay and quality. The use of a table effectively performs the steps of determining a cost value and determining whether that cost value exceeds a threshold.

Processing at blocks 148 and 150 can be performed selectively on a per-frame or per-packet basis. For example, given the values of Dc, Ds and Q, retransmission selector 86 can determine whether all of the missing source packets in the frame should be retransmitted. Alternatively, the decision to retransmit packets can be made on a packet-by-packet basis depending on factors such as network state. For example, if the network is congested, requests for retransmission can be limited to the most important packets in the NACK list 85, such as for example those packets most important for adequate decoding based on per-packet Dc and Ds models. Alternatively, importance can be determined by use of a lookup table such as for example Table 7 below. The importance, as shown in Table 7, may be based on the partition ID of the packet (2 columns in the table) and the frame type (3 rows in the table).

TABLE 7

|  | $1^{st}$ Partition | $2^{nd}$ Partition |
|---|---|---|
| Key Frame | Y | Y |
| Delta | Y | N |
| Non-reference (Delta) Frame | N | N |

In an alternative embodiment, off-line study can be conducted on packet losses and the impact of those losses on decoded frame quality. The off-line study can include for example the following steps. A simulation is provided of a frame that is encoded, packetized and sent to a decoder with transmission over the network. For purposes of the simulation, prior transmitted frames can be correctly decoded. The simulation is conducted over a range of parameters, including for example:

Frame resolution such as dimension and frame rate;
Frame type (such as delta or key);
Target bit rate;
Packet loss such as percentage of total loss, relative percentage per partition; or
Variety of test sequences.

Packet loss can then be simulated and decoding can take place over an error-prone frame. The error-prone frame is created to monitor the number, location and/or affiliation of the dropped packets. The following values are monitored to the decoded error-prone frame:

Decode error such as whether the frame was decoded or dropped; and
PSNR/SSIM and other objective metrics to quantify the quality of the frame The results of the monitoring are then clustered into classes, such as four classes. Exemplary classes include Bad (decoder was unable to decode the frame) and {Poor, Acceptable and Good}. Threshold values for use in the cost function J are then computed using k-means clustering on the objective metrics. The threshold values can be further computed given frame dimension and target bit rate. The analysis can also be conducted on a per-frame and per-packet basis.

All or a portion of embodiments of the present invention can take the form of a computer program product accessible from, for example, a computer-usable or computer-readable medium such as memories 20, 24. A computer-usable or computer-readable medium can be any device that can, for example tangibly contain, store, communicate, and/or transport the program for use by or in connection with any processor. The medium can be, for example, an electronic, magnetic, optical, electromagnetic, or a semiconductor device. Other suitable mediums are also available. For example, computer instructions for implementing the techniques described above can be stored on the computer-readable medium (such as memories 20, 24). These instructions, when executed by a computer, cause the computer to form the above-described techniques.

References herein to "determining" a value include both determining the actual value or an estimate of the actual value, whether by means of calculations, accepting user input for the value, retrieving the value from memory of any kind, receiving the value from an external resources such as a server, selecting or identifying the value from a set of values, or otherwise creating or ascertaining the value (or an estimate of the value) by any means whatsoever using a processor, such as a computer or any other device of any kind capable of processing information.

The above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

The invention claimed is:

1. A method for processing a packetized video signal including at least one encoded frame, comprising:
    receiving the packetized video signal over a network, the packetized video signal including at least one received packet associated with the at least one encoded frame and having embedded data, wherein the at least one received packet is at least one error correction packet, the embedded data resides in a header of the at least one received packet, and the embedded data includes a packet mask;
    identifying at least one lost packet that is missing from the packetized video signal as received over the network;
    determining at least one packet loss state value based at least in part upon at least a portion of the embedded data, wherein the at least one packet loss state value includes a number of packets, inclusive of missing packets, in the at least one encoded frame that is determined at least in part as a function of the packet mask, and the number of packets in the at least one encoded frame is determined at least in part as a function of a lower bound value equal to a highest position value for any significant bit in the packet mask; and
    initiating a request over the network for retransmission of the at least one lost packet based at least in part on the at least one packet loss state value.

2. The method of claim 1, wherein the at least one packet loss state value includes information that identifies the at least one encoded frame.

3. The method of claim 1, wherein the at least one packet loss state value includes a number of packets missing from the at least one encoded frame as contained in the packetized video signal received over the network.

4. The method of claim 1, wherein the at least one packet loss state value includes information that indicates whether the at least one lost packet is a source packet or an error correction packet.

5. The method of claim 1, wherein the at least one packet loss state value includes information that identifies a partition in the at least one encoded frame to which the at least one lost packet belongs.

6. The method of claim 5, wherein the at least one received packet is an error correction packet having embedded data that includes a base sequence number and packet mask configured for unequal protection of at least some source packets in the at least one encoded frame, wherein the method further comprises:
    determining whether the lost packet contains at least a portion of the partition based at least in part on the base sequence number of the error correction packet.

7. The method of claim 1, wherein the embedded data includes a base sequence number corresponding to the sequence number of a first packet in the at least one encoded frame.

8. The method of claim 1, wherein the embedded data includes a base sequence number corresponding to a sequence number of a packet that contains at least a portion of a partition of the at least one encoded frame.

9. The method of claim 1, further comprising:
    determining whether the at least one lost packet is likely to be a source packet or an error correction packet based at least in part on the embedded data, wherein initiating a request over the network for retransmission of the at least one lost packet is based on the determination of whether the at least one lost packet is likely to be a source packet or an error correction packet.

10. The method of claim 1, wherein the at least one encoded frame includes at least a first partition, and the embedded data includes a base sequence number and a packet mask, the method further comprising:
    determining whether the missing packet contains information associated with the first partition based on at least one of the base sequence number or the packet mask.

11. The method of claim 1, wherein the at least one packet loss state value is an estimated value.

12. A computer program product comprising a non-transitory computer readable medium having instructions encoded thereon that, when executed by a processor, cause the processor to:
    receive the packetized video signal from over a network, the packetized video signal including at least one received packet associated with the at least one encoded frame and having embedded data, wherein the at least one received packet is at least one error correction packet, the embedded data resides in a header of the at least one received packet, and the embedded data includes a packet mask;
    identify at least one lost packet that is missing from the packetized video signal as received from over the network;
    determine at least one packet loss state value based at least in part upon at least a portion of the embedded data in the at least one received packet, wherein the at least one packet loss state value includes a number of packets, inclusive of missing packets, in the at least one encoded frame that is determined at least in part as a function of the packet mask, and the number of packets in the at least one encoded frame is determined at least in part as a function of a lower bound value equal to a highest position value for any significant bit in the packet mask; and
    initiate a request over the network for retransmission of the at least one lost packet based at least in part on the at least one packet loss state value.

13. The computer program product of claim 12, wherein the embedded data includes a base sequence number.

14. The computer program product of claim 12, wherein the at least one packet loss state value is an estimated value.

15. A apparatus for processing a packetized signal including at least one encoded frame having at least one received packet having a packet header information, comprising:
    memory; and
    a processor configured to execute instructions stored in the memory, wherein the instructions cause the processor to perform operations including:
        receiving the packetized video signal over a network, the packetized video signal including at least one received packet associated with the at least one encoded frame and having embedded data, wherein the at least one received packet is at least one error correction packet, the embedded data resides in a header of the at least one received packet, and the embedded data includes a packet mask;
        identifying at least one lost packet that is missing from the packetized video signal as received over the network;
        determining at least one packet loss state value based at least in part upon at least a portion of the embedded data, wherein the at least one packet loss state value includes a number of packets, inclusive of missing packets, in the at least one encoded frame that is determined at least in part as a function of the packet mask, and the number of packets in the at least one encoded frame is determined at least in part as a function of a lower bound value equal to a highest position value for any significant bit in the packet mask; and
        initiating a request over the network for retransmission of the at least one lost packet based at least in part on the at least one packet loss state value.

16. The apparatus of claim 15, wherein the at least one packet loss state value includes information that identifies a partition in the at least one encoded frame to which the at least one lost packet belongs.

17. The apparatus of claim 15, wherein the at least one packet loss state value includes information that identifies a partition in the at least one encoded frame to which the at least one lost packet belongs and the at least one received packet is an error correction packet having embedded data that includes a base sequence number and packet mask configured for unequal protection of at least some source packets in the at least one encoded frame, wherein the instructions cause the processor to perform operations further including:
    determining whether the lost packet contains at least a portion of the partition based at least in part on the base sequence number of the error correction packet.

18. The apparatus of claim 15, wherein the instructions cause the processor to perform operations further including:
    determining whether the at least one lost packet is likely to be a source packet or an error correction packet based at least in part on the embedded data, wherein initiating a request over the network for retransmission of the at least one lost packet based on the determination of whether the at least one lost packet is likely to be a source packet or an error correction packet.

19. The apparatus of claim 15, wherein the at least one encoded frame includes at least a first partition, and the embedded data includes a base sequence number and a packet mask, wherein the instructions cause the processor to perform operations further including:

determining whether the missing packet contains information associated with the first partition based on at least one of the base sequence number or the packet mask.

20. The apparatus of claim 15, wherein the at least one packet loss state value is an estimated value.

* * * * *